(12) United States Patent
Grodzki et al.

(10) Patent No.: US 9,915,718 B2
(45) Date of Patent: Mar. 13, 2018

(54) METHOD AND MAGNETIC RESONANCE APPARATUS TO DETERMINE A SENSITIVITY PROFILE OF A LOCAL COIL

(71) Applicant: Siemens Aktiengesellschaft, Munich (DE)

(72) Inventors: David Grodzki, Erlangen (DE); Wilfried Landschuetz, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 583 days.

(21) Appl. No.: 14/501,399

(22) Filed: Sep. 30, 2014

(65) Prior Publication Data

US 2015/0091566 A1   Apr. 2, 2015

(30) Foreign Application Priority Data

Sep. 30, 2013 (DE) .......................... 10 2013 219 750

(51) Int. Cl.
  *G01R 33/561* (2006.01)
  *G01R 33/36* (2006.01)
  (Continued)

(52) U.S. Cl.
  CPC ......... *G01R 33/561* (2013.01); *G01R 33/246* (2013.01); *G01R 33/36* (2013.01);
  (Continued)

(58) Field of Classification Search
  CPC .... G01R 33/561; G01R 33/246; G01R 33/36; G01R 33/4816; G01R 33/4818; G01R 33/5659
  See application file for complete search history.

(56) References Cited

U.S. PATENT DOCUMENTS

2009/0309594 A1*  12/2009  Feiweier .............. G01R 33/288
                                                    324/309
2012/0076378 A1*  3/2012  Keereman .......... G01R 33/4808
                                                    382/131
(Continued)

OTHER PUBLICATIONS

"Ultrashort Echo Time Imaging Using Pointwise Encoding Time Reduction With Radial Acquisition (PETRA)," Grodzki et al., Magnetic Resonance in Medicine, vol. 67 (2012), pp. 510-518.
(Continued)

*Primary Examiner* — Gregory H Curran
(74) *Attorney, Agent, or Firm* — Schiff Hardin LLP

(57) ABSTRACT

In a method for the determination of sensitivity profiles of local coils in the acquisition of magnetic resonance data, a first measurement data set of an examination area is acquired with a first acquisition coil, a second measurement data set of the examination area is acquired with a local coil, and a sensitivity profile of the local coil that is used is determined on the basis of the first measurement data set and the measurement data set. The first measurement data set and the second measurement data set are acquired using a pulse sequence with ultrashort echo times. In the determination of the sensitivity profile, errors due to dephasings are avoided as best as possible by the acquisition of the measurement data sets with a pulse sequence with ultrashort echo times (i.e. in particular echo times TE shorter than 0.5 ms); in particular, the dephasings are smaller given these echo times than in the case of gradient echo (GRE)-based pulse sequences.

11 Claims, 2 Drawing Sheets

(51) Int. Cl.
*G01R 33/48* (2006.01)
*G01R 33/24* (2006.01)
*G01R 33/565* (2006.01)

(52) U.S. Cl.
CPC ..... *G01R 33/4816* (2013.01); *G01R 33/4818* (2013.01); *G01R 33/5659* (2013.01)

(56) References Cited

U.S. PATENT DOCUMENTS

2012/0229136 A1  9/2012  Stemmer
2014/0077810 A1  3/2014  Grodzki

OTHER PUBLICATIONS

"3D Ultrashort Echo-Time Imaging using a 32 Channel Receive Array," Rahmer et al., Proc. Intl. Soc. Mag. Reson. Med., vol. 13 (2005), p. 795.

* cited by examiner

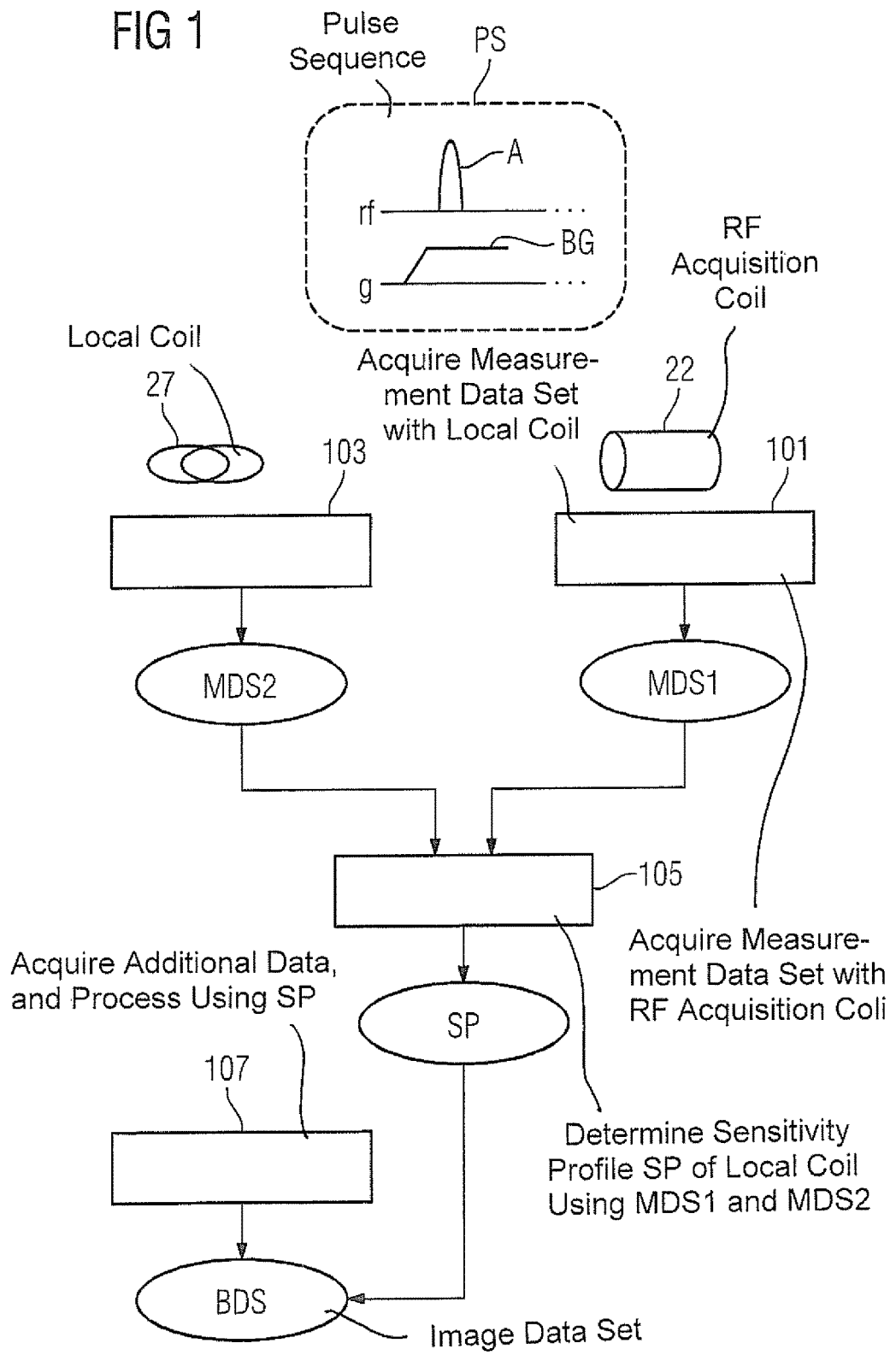

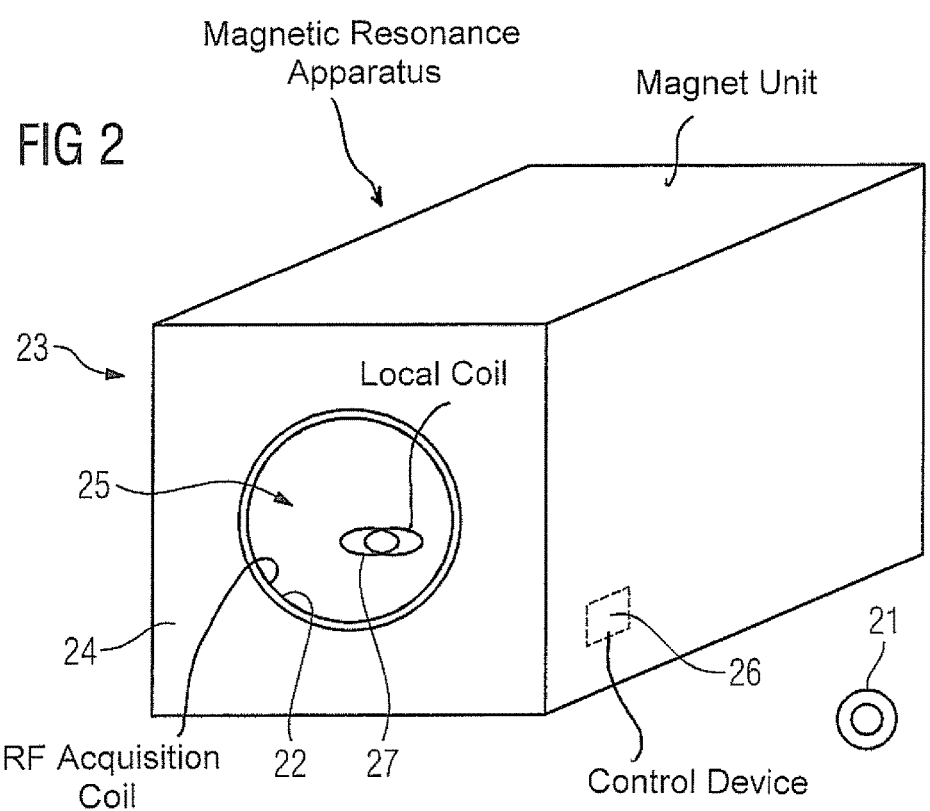

METHOD AND MAGNETIC RESONANCE APPARATUS TO DETERMINE A SENSITIVITY PROFILE OF A LOCAL COIL

BACKGROUND OF THE INVENTION

Field of the Invention

The invention concerns the determination of sensitivity profiles of local coils in magnetic resonance technology.

Description of the Prior Art

Magnetic resonance technique (MR) is a known modality with which images of the inside of an examination subject can be generated. Expressed in a simplified form, the examination subject is positioned in a strong, static, homogeneous basic magnetic field (also called a B-field) with a field strength of 0.2 to 7 Tesla or more in a magnetic resonance apparatus, such nuclear spins in the subject orient along the basic magnetic field. To trigger magnetic resonances, radio-frequency excitation pulses (RF pulses) are radiated into the examination subject, the triggered nuclear magnetic resonances are measured as what are known as k-space data, and MR images are reconstructed or spectroscopy data are determined on the basis of these. For spatial coding of the measurement data, rapidly activated magnetic gradient fields are superimposed on the basic magnetic field. The acquired measurement data are digitized and stored as complex numerical values in a memory organized as a k-space matrix. For example, an associated MR image can be reconstructed by a multidimensional Fourier transformation of the data (values) in the k-space matrix.

The measurement of the magnetic resonances (i.e., the MR signal) takes place with at least one acquisition coil, wherein normally an antenna known as a "body coil" is integrated into the magnetic resonance apparatus. However, this body coil is relatively far removed from the subject to be examined (a patient, for example) due to the integration into the magnetic resonance apparatus. Therefore, smaller coils—known as local coils—are often also used to receive the magnetic resonance signals, which local coils can be placed directly on the subject to be examined, or at least near to the subject, in order to achieve a better signal-to-noise ratio.

Such local coils often embody a large number of smaller acquisition coils. Each coil element has a channel. By utilizing the multiple acquisition channels that are thus present, advanced imaging methods such as parallel imaging can be executed. The information of the individual channels is combined in the image reconstruction algorithm and presented in the MR image.

Depending on the alignment and spacing of the coil elements of the local coil from the measured subject, the individual channels of the acquisition coil acquire signals of differing strengths. When respective signals of the channel are combined, this can therefore lead to signal inhomogeneities in the MR image in which, for example, regions that are situated closer to the coils will appear markedly brighter than regions situated more distant (for example inside the subject).

In order to avoid these inhomogeneities, for every MR examination the (current) sensitivity distribution of the local coil is measured, most often in a preceding measurement. In this measurement, an image of the measured subject is acquired with the body coil and an image is acquired with the local coil that is being used. In comparison to the image acquired with the local coil, the image acquired with the body coil has a high homogeneity. By processing the two images (which includes a division, among other things), the intensity distribution of the local coil image (and therefore its sensitivity distribution) can be calculated. In the following (for example clinical) MR measurements, arising signal inhomogeneities can be remedied using this sensitivity distribution of the local coil, and a homogeneous image can be created.

A gradient echo sequence (GRE) is most often used as a measurement sequence for such upstream measurements to determine the sensitivity distribution of the local coil. The sequence that is used is very loud. Usually, noise levels of well over 90 dB(A) occur due to the gradients to be switched.

SUMMARY OF THE INVENTION

An object of the invention is to enable a determination of sensitivity distributions of local coils without such a noise exposure.

A method according to the invention for the determination of sensitivity profiles of local coils in magnetic resonance includes the steps.

A first measurement data set of an examination area is acquired using a first acquisition coil.

A second measurement data set of the examination area is acquired using a local coil.

A sensitivity profile of the local coil that is used is determined on the basis of the first measurement data set and the measurement data set.

The first measurement data set and the second measurement data set are acquired using a pulse sequence with ultrashort echo times.

In the determination of the sensitivity profile, errors due to dephasings are avoided as best as possible by the acquisition of the measurement data sets with a pulse sequence with ultrashort echo times (i.e. in particular echo times TE shorter than 0.5 ms); in particular, the dephasings are smaller given these echo times than given gradient echo (GRE)-based pulse sequences.

In the pulse sequence used to acquire the first measurement data set and the second measurement data set, excitation pulses can furthermore be radiated first if the associated imaging gradient has already reached its full strength. In this way, the noise exposure is markedly reduced (in particular for an examined patient, but also for the personnel in charge of the measurement) since such pulse sequences are nearly silent. In particular, the pulse sequence used to acquire the first measurement data set and the second measurement data set can be a PETRA or zTE pulse sequence.

A magnetic resonance system according to the invention has a control device designed to implement the method according to the invention.

The present invention also encompasses a non-transitory, computer-readable data storage medium encoded with programming instructions that, when the storage medium is loaded into a control computer of a magnetic resonance apparatus, cause the control computer to operate the magnetic resonance apparatus to implement the method according to the invention, as described above.

The advantages and embodiments indicated with regard to the method apply analogously to the magnetic resonance system and the electronically readable data storage medium.

BRIEF DESCRIPTION OF THE DRAWINGS

FIG. 1 schematically depicts an embodiment of the method according to the invention to determine sensitivity profiles of local coils in magnetic resonance engineering.

FIG. 2 schematically illustrates a magnetic resonance system according to the invention.

DESCRIPTION OF THE PREFERRED EMBODIMENTS

FIG. 1 schematically shows a method according to the invention for the determination of sensitivity profiles of local coils in magnetic resonance engineering. A first measurement data set MDS1 of an examination area to be examined is acquired with a first RF acquisition coil 22 of the magnetic resonance system, this first RF acquisition coil 22 having only one channel (Block 101). For example, the first acquisition coil is a body coil that is already integrated into the magnetic resonance system. A second measurement data set MDS2 of the same examination area is acquired with a local coil 27 of the magnetic resonance system (Block 103). For example, the local coil 27 has at least two individual coils, for example up to 20 individual coils or even more which respectively have their own channel and thus individually emit their own signal to the control device of the magnetic resonance system.

In a step 105, a sensitivity profile SP of the local coil 27 that is used is determined on the basis of the first measurement data set MDS and the second measurement data set MDS2. For example, this occurs in that a respective image is reconstructed from the first measurement data set MDS1 and second measurement data set MDS2.

The image of the first acquisition coil 22 exhibits a high homogeneity. Depending on the spacing, position and orientation of the examination area to be examined relative to the local coil 27, different signal strengths can be present, in particular at the different channels of the local coil 27. Therefore, inhomogeneities often occur in the image of the local coil 27.

The homogeneity distribution can be determined via combination of the image reconstructed from the first measurement data set MDS1 and the image reconstructed from the second measurement data set MDS2, and from this homogeneity distribution the sensitivity profile SP can be determined in a known manner.

In the method according to the invention, the first measurement data set MDS1 and the second measurement data set MDS2 are acquired by operating the MR apparatus with a pulse sequence PS with ultrashort echo times. In this way, errors in the determination of the sensitivity profile SP due to dephasings in the two measurement data sets MDS1 and MDS2 are avoided as best possible.

In particular, the first measurement data set MDS1 and the second measurement data set MDS2 are acquired using a pulse sequence PS with ultrashort echo time, which includes an imaging gradient BG (in gradient line g) that was already activated for excitation (excitation pulse A in radio-frequency line rf). For example, a zTE or PETRA pulse sequence can be used to acquire the first measurement data set MDS1 and the second measurement data set MDS2. The advantage of these pulse sequences is that they are (nearly) silent in comparison to a noise level of over 90 dB(A) given a GRE-based measurement.

The determined sensitivity profile SP can furthermore be used in an acquisition of additional measurement data (Block 107) by the local coil 27 (which additional measurement data are processed into an image data set BDS) in order to correct inhomogeneities in said image data set BDS. The acquisition of additional measurement data can pertain to the implementation of clinically relevant measurements. The intensity that is measured with the local coil 26 at the coil channels upon acquisition of the additional measurement data can be combined with the sensitivity profile SP, and an inhomogeneous signal distribution can thus be corrected.

For example, in a simple exemplary embodiment the first measurement data set MDS1 and the second measurement data set MDS2 can be acquired in succession.

However, the first measurement data set MDS1 and the second measurement data set MDS2 can also be acquired in an interleaved manner in order to keep down errors due to intervening movements, etc.

In particular, each the two measurement data sets MDS1 and MDS2 can hereby be acquired in at least three sub-measurements, wherein each sub-measurement covers a partial and the sub-measurements are executed in succession in such an order that two successive sub-measurements are associated with different measurement data sets of the two measurement data sets, and such that two successive sub-measurements respectively do not measure the same partial region. Due to the interleaved acquisition of the sub-measurements associated with the two measurement data sets MDS1 and MDS2, the movement sensitivity of the acquisitions is reduced, wherein unwanted refocusings—and therefore artifacts, for example due to echo signals of residual magnetization—are also avoided due to the avoidance of successive sub-measurements which measure the same partial region.

The measurement can proceed by implementing two successive sub-measurements that respectively measure different partial regions of the measurement data sets MDS1 and MDS2 associated with them, such that the discontinuities in the gradients that are to be activated for the successive sub-measurements, which discontinuities are necessary for the measurements of the different partial regions, do not exceed a threshold. The threshold can hereby be selected such that the necessary discontinuities in the activation of the gradients do not produce noise that exceeds a desired maximum noise volume.

Furthermore, the sub-measurements can follow one another such that two successive sub-measurements measure partial regions between which are situated a maximum of two additional partial regions that are not measured by the successive sub-measurements. The sub-measurements are therefore always acquired with an offset of a pair of repetitions of the pulse sequence. Identical sub-measurements which cover the partial region of k-space corresponding to the examination subject to be examined do not follow one another directly, but rather are interleaved with one another. The gradients to be switched thereby always change between the individually measured sub-measurements. An unwanted refocusing of the residual magnetization of the preceding sub-measurements can thus be avoided. Furthermore, it is taken into account that gradient discontinuities between individual sub-measurements are not too large; the measurement can be kept quiet overall.

FIG. 2 shows a schematic drawing of a magnetic resonance apparatus 23 according to the invention. As is known in principle, this comprises a basic magnet unit 24 that defines a patient receptacle 25 that can be provided surrounding a radio-frequency coil arrangement (in particular a body coil 22) and a gradient coil arrangement. Furthermore, the magnetic resonance apparatus 23 can have at least one additional, transportable radio-frequency coil arrangement (a local coil 27) that can be variably introduced into the patient receptacle. For example, the local coil 27 can comprise at least two individual coils, each with a respective acquisition channel. The operation of the magnetic resonance system 23 is controlled by a control device 26 that is designed to implement the method according to the invention, in particular thus to determine sensitivity profiles of local coils as described.

For example, the method according to the invention is implemented via a computer program at a control device 26 of the magnetic resonance system 23 when it is executed at said control device 26. For this, the control device 26 is therefore designed to be able to implement a method according to the invention. For example, an electronically readable data medium 21 has electronically readable control information stored thereon that is designed to cause the control device 26 to operate the magnetic resonance apparatus 23 to implement the method according to the invention to determine sensitivity profiles of local coils as described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to determine a sensitivity profile of a local coil in a magnetic resonance apparatus, comprising:
   operating a magnetic resonance apparatus using a pulse sequence having ultrashort echo times to acquire a first measurement data set of an examination area using a radio-frequency (RF) acquisition coil of the magnetic resonance apparatus;
   operating the magnetic resonance apparatus using said pulse sequence with ultrashort echo times to acquire a second measurement data set of the examination area with a local coil in the magnetic resonance apparatus, with said first measurement data set being acquired interleaved with said second measurement data set;
   providing said first measurement data set and said second measurement data set to a computer and, in said computer, determining a sensitivity profile of the local coil from the first measurement data set and the second measurement data set; and
   in said computer, generating an electronic signal representing said sensitivity profile of the local coil, and making said electronic signal available at an output of said computer.

2. A method as claimed in claim 1 comprising using, as said pulse sequence with ultrashort echo times, a pulse sequence comprising an RF excitation pulse and an associated imaging gradient, wherein said RF excitation pulse is radiated when the imaging gradient reaches full strength.

3. A method as claimed in claim 1 comprising using, as said pulse sequence with ultrashort echo times, a pulse sequence selected from the group consisting of a PETRA sequence and a zTE sequence.

4. A method as claimed in claim 1 comprising using, as said local coil, a local coil comprised of at least two individual coils, each having a respective acquisition channel via which said second measurement data set is acquired.

5. A method as claimed in claim 1 comprising operating said magnetic resonance apparatus to acquire said first measurement data set and said second measurement data set in succession.

6. A method as claimed in claim 1 comprising operating said magnetic resonance apparatus to acquire said first measurement data set in at least three sub-acquisitions and to acquire said second measurement data set in three sub-acquisitions respectively interleaved with said three sub-acquisitions of said first measurement data set, and entering measurement data from each sub-acquisition into a partial region of k-space, in an electronic memory organized as k-space, the respective partial regions, in combination, covering said examination area, with no two successive sub-acquisitions, among the respective sub-acquisitions of said first measurement data set and said second measurement data set, acquiring data from a same partial region.

7. A method as claimed in claim 6 comprising operating said magnetic resonance apparatus to activate a gradient for each of said sub-acquisitions, with successive gradients exhibiting a gradient strength discontinuity therebetween, and operating said magnetic resonance apparatus so that the respective discontinuities of the respective gradients do not exceed a predetermined threshold.

8. A method as claimed in claim 7 comprising operating said magnetic resonance apparatus with two successive sub-acquisitions acquiring data for respective partial regions of said examination area, between which are situated a maximum of two additional partial regions from which data are not acquired by said two successive sub-acquisitions.

9. A method as claimed in claim 1 comprising operating said magnetic resonance apparatus to acquire additional measurement data from said examination area using said local coil, and processing said additional measurement data in said computer by implementing a reconstruction algorithm to generate image data from said additional measurement data wherein said sensitivity profile is used to correct inhomogeneities that exist in said magnetic resonance apparatus during the acquisition of said additional measurement data.

10. A magnetic resonance apparatus comprising:
    a magnetic resonance data acquisition unit comprising a radio-frequency (RF) acquisition coil, and having a local coil therein;
    a control unit configured to operate the magnetic resonance data acquisition unit using pulse sequence having ultrashort echo times to acquire a first measurement data set of an examination area using said RF acquisition coil;
    said control unit being configured to operate the magnetic resonance data acquisition unit using said pulse sequence with ultrashort echo times to acquire a second measurement data set of the examination area with said local coil, with said first measurement data set being acquired interleaved with said second measurement data set;
    a computer provided with said first measurement data set and said second measurement data set, said computer being configured to determine a sensitivity profile of the local coil from the first measurement data set and the second measurement data set; and
    said computer being configured to generate an electronic signal representing said sensitivity profile of the local coil, and to make said electronic signal available at an output of said computer.

11. A non-transitory, computer-readable data storage medium encoded with programming instructions, said storage medium being loaded into a computerized processor of a magnetic resonance apparatus, comprising an RF acquisition coil and a local coil, and said programming instructions causing said computerized processor to:
    operating the magnetic resonance apparatus using a pulse sequence having ultrashort echo times to acquire a first measurement data set of an examination area using the RF acquisition coil of the magnetic resonance apparatus;
    operate the magnetic resonance apparatus using said pulse sequence with ultrashort echo times to acquire a second measurement data set of the examination area with said local coil in the magnetic resonance apparatus, with said first measurement data set being acquired interleaved with said second measurement data set;

determine a sensitivity profile of the local coil from the first measurement data set and the second measurement data set; and generate an electronic signal representing said sensitivity profile of the local coil, and make said electronic signal available at an output of said computer.

* * * * *